United States Patent
Okuyama (10) Patent No.: US 7,119,875 B2
(45) Date of Patent: Oct. 10, 2006

(54) APPARATUS FOR FORMING PATTERN

(75) Inventor: Takashi Okuyama, Saitama (JP)

(73) Assignee: ORC Manufacturing Co., Ltd., Tokyo (JP)

( * ) Notice: Subject to any disclaimer, the term of this patent is extended or adjusted under 35 U.S.C. 154(b) by 150 days.

(21) Appl. No.: 10/834,235

(22) Filed: Apr. 29, 2004

(65) Prior Publication Data

US 2005/0030500 A1 Feb. 10, 2005

(30) Foreign Application Priority Data

May 8, 2003 (JP) ............................ P2003-129749

(51) Int. Cl.
- *G03B 27/42* (2006.01)
- *G03B 27/54* (2006.01)
- *B41J 2/47* (2006.01)
- *B41J 2/435* (2006.01)
- *G01D 15/14* (2006.01)

(52) U.S. Cl. .......................... 355/53; 355/67; 347/225; 347/247; 347/249

(58) Field of Classification Search ................. 355/53, 355/67; 347/225, 247, 249
See application file for complete search history.

(56) References Cited

U.S. PATENT DOCUMENTS

| | | | | |
|---|---|---|---|---|
| 5,241,330 A | | 8/1993 | Kawabata et al. | 347/258 |
| 5,247,373 A | | 9/1993 | Iwama et al. | 358/471 |
| 5,436,728 A | | 7/1995 | Watanabe | 356/431 |
| 6,507,713 B1 | * | 1/2003 | Koide | 399/51 |
| 6,646,715 B1 | * | 11/2003 | Makinouchi | 355/53 |
| 2001/0012042 A1 | * | 8/2001 | Suganuma | 347/120 |
| 2003/0025785 A1 | * | 2/2003 | Nihei et al. | 347/250 |
| 2004/0036757 A1 | * | 2/2004 | Yoshida | 347/132 |
| 2004/0070663 A1 | * | 4/2004 | Niito | 347/236 |
| 2004/0085439 A1 | * | 5/2004 | Takaki | 347/247 |
| 2004/0218161 A1 | | 11/2004 | Okuyama | |
| 2004/0223128 A1 | | 11/2004 | Okuyama | |
| 2005/0062836 A1 | * | 3/2005 | Nakajima | 347/225 |

FOREIGN PATENT DOCUMENTS

JP         2549011         8/1996

* cited by examiner

*Primary Examiner*—W. B. Perkey
*Assistant Examiner*—Vivian Nelson
(74) *Attorney, Agent, or Firm*—Greenblum & Bernstein, P.L.C.

(57) ABSTRACT

An apparatus for forming a pattern has a scanning-time setter, a time-error detector, a scanning-time corrector, a pulse data selector, and a control pulse signal generator. The scanning-time setter sets a "fine-section scanning-time" as a pass-time of the beam for each section of a series of fine sections. The time-error detector successively detects a time-error between the set fine-section scanning-time and an actually detected fine-section scanning-time for each fine section. The scanning-time corrector successively corrects the set fine-section scanning-time for each fine section on the basis of the time-error to successively generate a corrected fine-section scanning-time. The pulse data selector successively selects a set of pulse data, corresponding to the corrected fine-section scanning-time, from a series of sets of pulse data. The control-pulse signal generator successively generates a sequence of control-pulse signals in accordance with a selected set of pulse data.

8 Claims, 10 Drawing Sheets

| ADRESS | TRIGGER PULSE NUMBER (TP) |
|---|---|
|  | 200 (AD$_1$) |
|  | 400 (AD$_2$) |
|  | 600 (AD$_3$) |
|  |  |
|  |  |
|  |  |

FIG. 10

APPARATUS FOR FORMING PATTERN

BACKGROUND OF THE INVENTION

1. Field of the Invention

The present invention relates to abeam writer that forms a circuit pattern on a substrate such as a film board and a glass board, or that forms an image on a sheet for recording. Especially, it relates to controlling beam-modulation.

2. Description of the Related Art

A beam writer, such as laser writer, forms an electric circuit pattern on a substrate, such as a silicon wafer, and so on. While, a laser scanner forms an image on a paper. The above beam writer has, for example, an exposure optical system with a polygon mirror and an f-θ lens, and scans an electronic beam or laser beam on a photosensitive material by using the exposure optical system. Then, an optical-modulator incorporated in the exposure optical system, such as an AOM (Acousto-Optical Modulator), modulates the beam. Namely, the optical modulator controls the exposure on the photosensitive material by passing and intercepting the beam in accordance with pattern-data. The beam modulation is controlled by a sequence of high frequency control pulse signals.

The scanning-speed of the beam is not always constant due to the precision of the f-θ lens and the polygon mirror. The differing precision results in an irregular scanning-speed, in other words, the irregular scanning-speed is caused by degrees of the precision. To correct the irregular scanning-speed, the frequency of the control pulse signals for modulating the beam is modified in accordance with the variation of the scanning-speed. For example, a scanning line is divided into constant distance-intervals, and a time-interval, which is a pass-time of the beam in each distance-interval, is successively measured along the scanning-line before forming the pattern. Then, when scanning the beam, the clock frequency is adjusted in accordance with the detected series of time-intervals. In order to minimize a dot-pitch of the pattern, as much as possible, a PLL (Phase-Locked Loop) circuit is utilized to generate clock pulses with an accurate frequency.

SUMMARY OF THE INVENTION

An object of the present invention is to provide an apparatus that rapidly and effectively forms a pattern in accordance with a varying scanning-speed, an apparatus that generates a sequence of control pulse signals for forming a. pattern, and a method that generates a sequence of control pulse signals for forming a pattern.

An apparatus for forming a pattern according to the present invention has a light source, a scanning unit, a scanning-time setter, a time-error detector, a scanning-time corrector, a pulse data selector, a control pulse signal generator, and a writing pulse signal generator. The light source emits a beam, and the scanning unit scans the beam on a photosensitive material. The scanning-time setter sets a "fine-section scanning-time" as a pass-time of the beam for each section of a series of fine sections. The series of fine sections is defined by dividing a scanning-line at constant-intervals. The time-error detector successively detects a time-error between the set fine-section scanning-time and an actually detected fine-section scanning-time for each fine section. The scanning-time corrector successively corrects the set fine-section scanning-time in each fine section on the basis of the time-error to successively generate a corrected fine-section scanning-time. The pulse data selector successively selects a set of pulse data, corresponding to the corrected fine-section scanning-time, from a series of sets of pulse data. Each of sets of pulse data in the series of sets of pulse data has a different data-array in accordance with the corrected fine-section scanning-time. The control pulse signal generator successively generates a sequence of control-pulse signals in accordance with a selected set of pulse data. The writing pulse signal generator successively generates a sequence of writing-pulse signals in accordance with the sequence of control-pulse signals. The sequence of control-pulse signals controls the output-timing of the sequence of writing-pulse signals. The optical modulator modulates the beam in accordance with the sequence of writing pulse signals.

BRIEF DESCRIPTION OF THE DRAWINGS

The present invention will be better understood from the description of the preferred embodiment of the invention set fourth below together with the accompanying drawings, in which.

DESCRIPTION OF THE PREFERRED EMBODIMENTS

Hereinafter, the preferred embodiment of the present invention is described with reference to the attached drawings.

Figure 1:
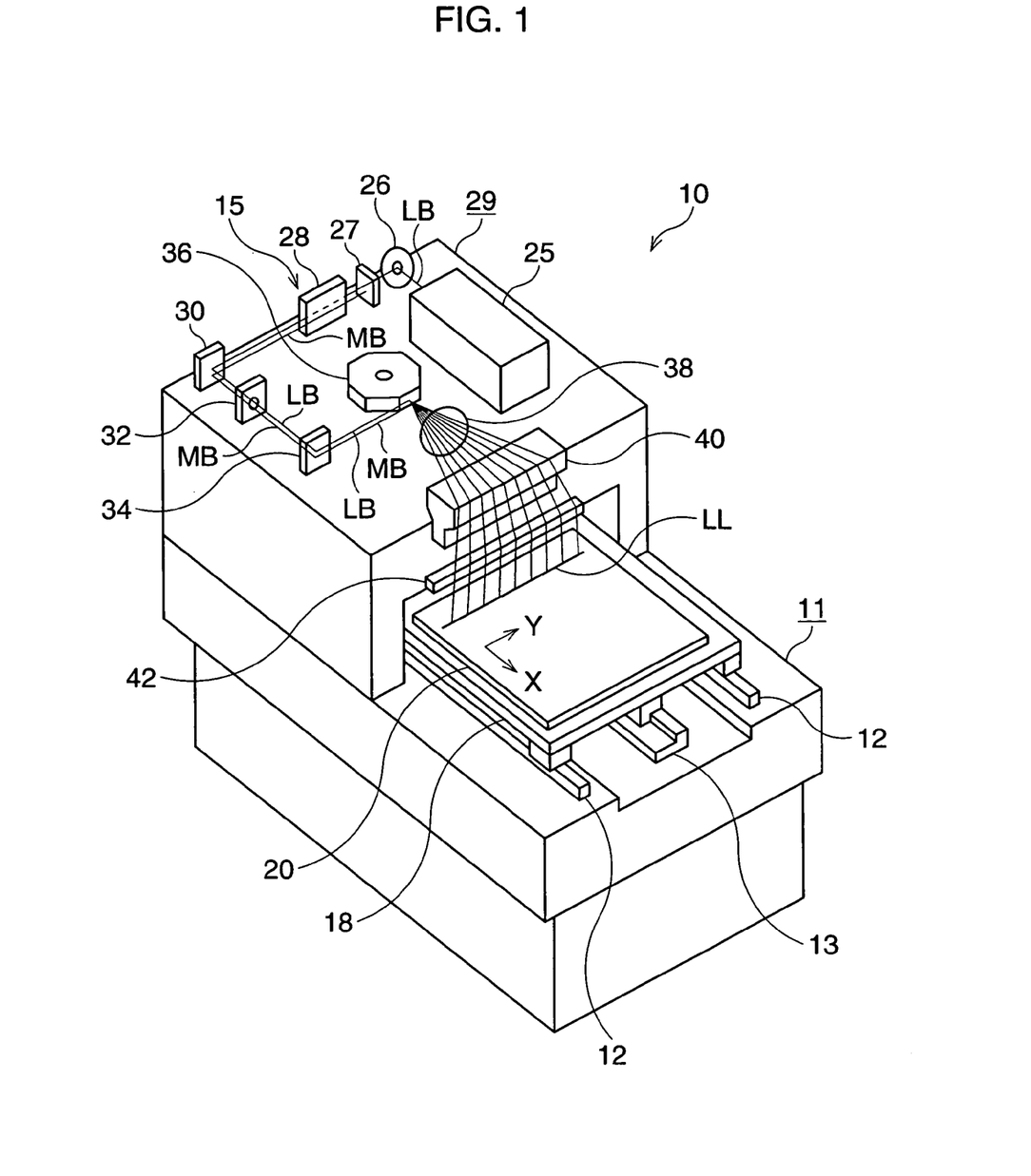
FIG. 1 is a schematic view of a laser writer according to an embodiment of the invention.

FIG. 1 is a schematic view of a laser writer according to an embodiment of the invention.

The laser writer 10 scans a laser beam on a substrate 20, such as a glass board or a film for a PWB (Printed Wiring Board, so as to form a circuit-pattern on the substrate 20. The laser writer 10 includes a base 11, a fixed table 29, and a writing table 18. The fixed table 29 and the writing table 18 are arranged on the base 11. A laser 25 and an exposure optical system 15 that transmits a beam from the laser 25 toward the writing table 18, are mounted on the fixed table 29.

Two rails 12 are arranged on the base 10 and are parallel to each other. A table driving mechanism 13 drives the writing table 18 so that the writing table 18 moves along the pair of rails 12. The substrate 20 with a photo-resist layer is located on the writing table 18 when scanning the beam and writing the circuit-pattern. Hereinafter, a direction perpendicular to the moving direction of the writing table 18 is represented as a "main-scanning direction (Y-direction)", and a direction parallel to the moving direction of the writing table 18 is represented as a "sub-scanning direction (X-direction)".

A first beam bender 26 deflects a laser beam LB, which is emitted from the laser 25, to a beam splitter 27 and an AOM (Acousto-Optical Modulator) 28. The AOM modulates the laser beam LB by transmitting and intercepting the beam LB in accordance with the pattern-data. The laser beam LB passing through the AOM 28 is directed to a polygon mirror 36 via a second beam bender 30, lens 32, and a third beam bender 34.

A polygon mirror 36 having a polyhedron composed of mirrors deflects the leaser beam LB to an f-θ lens 38 so as to scan the beam LB along the main-scanning direction (Y-direction). The laser beam LB passing through the f-θ lens 38 is directed to the writing table 18 via a turning mirror 40, and a condenser lens 42, so that the laser beam LB is irradiated on the writing table 18.

While the laser 25 emits the laser beam LB, the polygon mirror 28 revolves at constant speed, and each mirror of the polygon mirror 28 scans the beam LB along a total of a scanning-line LL. The AOM 28 is turned ON, which interrupts the beam LB or turned OFF, which passes the beam LB, in accordance with the pattern-data. The writing table 18 moves along the sub-scanning direction (X-direction), so that the polygon mirror 18 scans the beam LB along each scanning line in order, while the writing table 18 moves. Consequently, a circuit-pattern is formed on the total surface of the substrate 20.

The beam splitter 27 splits the beam 25 emitted from the laser 25 into two beams, one beam LB being used for scanning, the other beam MB (hereinafter, called a "monitor beam") being used for measuring the beam-position on the substrate 20. The two beams LB and MB, parallel to each other, are directed to the polygon mirror 36, and the monitor beam MB is directed to a standard scale (herein not shown) by a mirror (not shown), which is provided between the turning mirror 40 and the condenser lens 42. The polygon mirror 36 deflects the monitor beam MB on the standard scale while synchronizing with the beam LB. Thus, the position of the scanning beam LB on the substrate 20 is measured by detecting the position of the monitor beam MB on the standard scale. The AOM 28 is controlled in accordance with the position of the scanning-beam LB.

Figure 2:
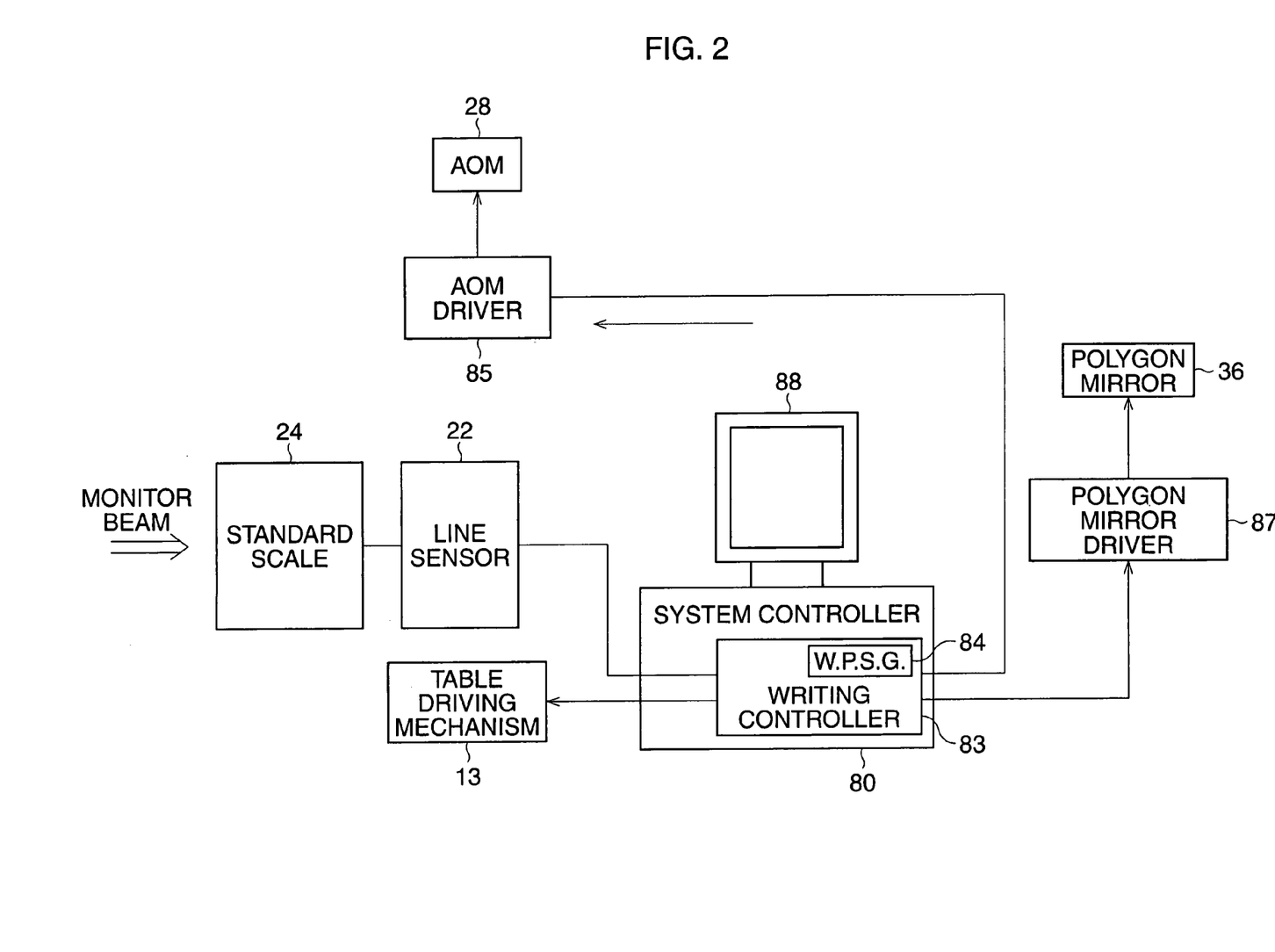
FIG. 2 is a block diagram of the laser writer.

FIG. 2 is a block diagram of the laser writer 10.

A system controller 80 controls the laser writer 10, and has a writing controller 83 and a monitor 88. The writing controller 83 with a writing pulse signal generator 84 outputs control signals to the table driving mechanism 13, the AOM driver 85, and a polygon mirror driver 87. The polygon mirror driver 87 revolves the polygon mirror 36 at a constant speed, and the table driving mechanism 13 shifts the writing table 18 at a constant-speed. The AOM driver 85 outputs control signals that turn the AOM 28 ON/OFF.

A line sensor 22 is provided at the rear of the standard scale 24, and extends along the standard scale 24. The line sensor 22 periodically detects the monitor beam MB passing through the standard scale 24, and outputs a detecting signal indicating the position of the monitor beam MB to the writing controller 83 in the system controller 80. The system controller 80 outputs driving signals to the table driving mechanism 13 in accordance with the detecting signal output from the line sensor 22, so as to shift the table driving mechanism 13 at a given speed corresponding to one line worth of scanning-time. The writing pulse signal generator 84 outputs a sequence of writing pulse signals to the AOM driver 85, which then outputs signals that turn the AOM 28 ON/OFF in accordance with the detecting signal of the monitor beam MB.

Figure 3:
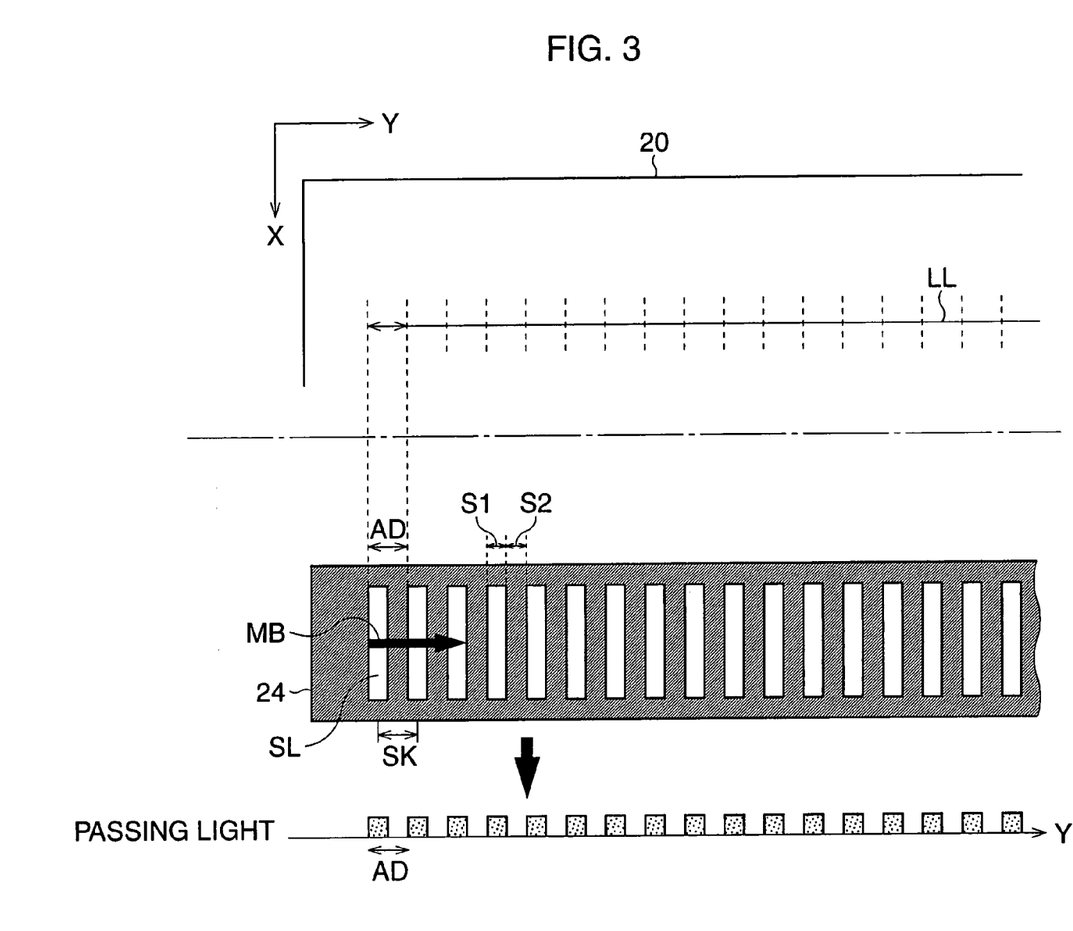
FIG. 3 is a view showing a standard scale.

FIG. 3 is a view showing the standard scale 24.

A plurality of slits "SL" is regularly and precisely formed on the standard scale 24 so that each interval between a slit and an adjacent slit is constant. The scanning-line "LL" is divided into a plurality of fine sections (intervals). The length of each fine interval "AD" corresponds to a sum of the width of the slit "S1", which transmits the monitor beam MB toward the line sensor 22, and the width of the interrupting portion "S2", which interrupts the monitor beam MB. To precisely form the slits "SL" on the standard scale 24, the fine section "AD" is longer than a dot-pitch (dot-interval) of the pattern to be formed on the substrate 20. Since the width of the slit "S1" is the same as the width of the interrupting portion "S2", one fine section "AD" corresponds to a slit-pitch "SK". For example, one fine section "AD" is defined to 100 μm ($100\times10^{-6}$ m).

While scanning the monitor beam MB on the standard scale 24, the pass and interruption of the monitor beam MB is repeated alternately. Consequently, a sequence of pulse signals (hereinafter, called "a series of scale signals") is output from the line sensor 22 to the writing controller 83. The position of the laser beam LB, which is synchronized with the monitor beam MB, is detected on the basis of the sequence of scale signals.

Figure 4:
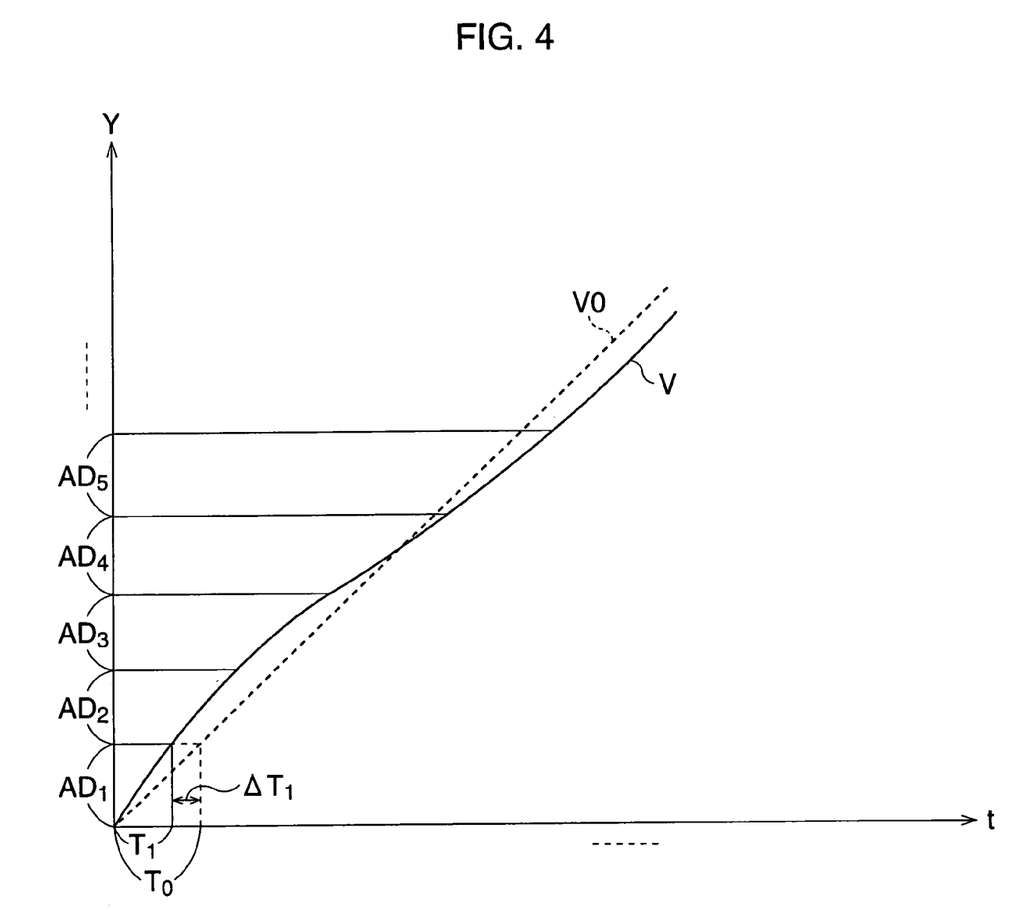
FIG. 4 is a view showing a shifted-distance of a monitor beam.
Figure 5:
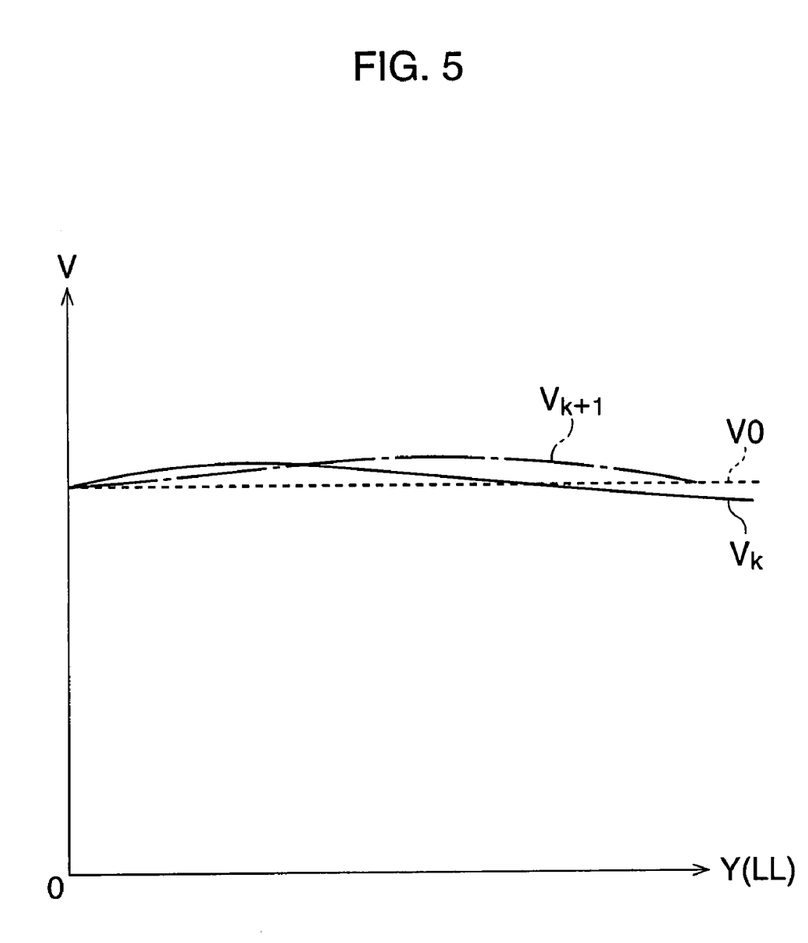
FIG. 5 is a view showing a scanning-speed for two reflecting surfaces of the polygon mirror.

FIG. 4 is a view showing a shifted-distance of the laser beam LB, and FIG. 5 is a view showing a scanning-speed for two reflecting surfaces of the polygon mirror 36. With reference to FIGS. 3 to 5, the characteristics of the scanning-speed will be explained.

In FIG. 4, the laser beam position from a scanning start point is shown as a function of time. The position of the laser beam LB is measured along the main-scanning direction (Y-direction). The scanning-speed along the main-scanning direction (Y-direction) is not constant due to a rotation-precision and a reflecting-surface precision of the polygon mirror 36. Consequently, the locus of the beam position is not represented as a straight line "V0", but is represented as a curved line "V". Note that, the variation of the scanning-speed due to the f-θ lens does not occur.

Accordingly, an actual scanning-time that is a pass-time of the laser beam LB in the fine section "AD" varies in accordance with the motion of the polygon mirror 36. When an optional fine section is designated as "$AD_j$" (j=1, 2, . . . ), and a time-interval, namely, the scanning-time for the fine section "$AD_j$" is designated as "$T_j$", the time-interval "$T_j$" occasionally does not coincide with a standard time-interval "T0" calculated using a preset scanning-speed, so that a time-error "$\Delta T_1$" occurs. The time-interval "$T_j$" becomes short when the actual scanning-speed in the fine section "$AD_j$" becomes faster than the preset scanning-speed, whereas the time-interval "$T_j$" becomes long when the actual scanning-speed in the fine section "$AD_j$" becomes slower than the preset scanning-speed.

As described above, the polygon-mirror 36 acts so as to scan the laser beam LB by rotating at constant speed, and each reflecting-surface periodically deflects the beam LB while the polygon mirror 36 rotates. However, the precision of each reflecting-surface is different. Further, an irregular rotating-speed occurs due to the characteristics of the polygon mirror driver 87, such as a motor. Accordingly, the scanning-speed varies along the scanning-line LL, and variation-characteristics of the scanning-speed differ for each reflecting-surface. In FIG. 5, two scanning-speeds "$V_k$"

and "$V_k+1$", which correspond to two reflecting-surfaces among the 8 reflecting-surfaces, are shown.

Figure 6:
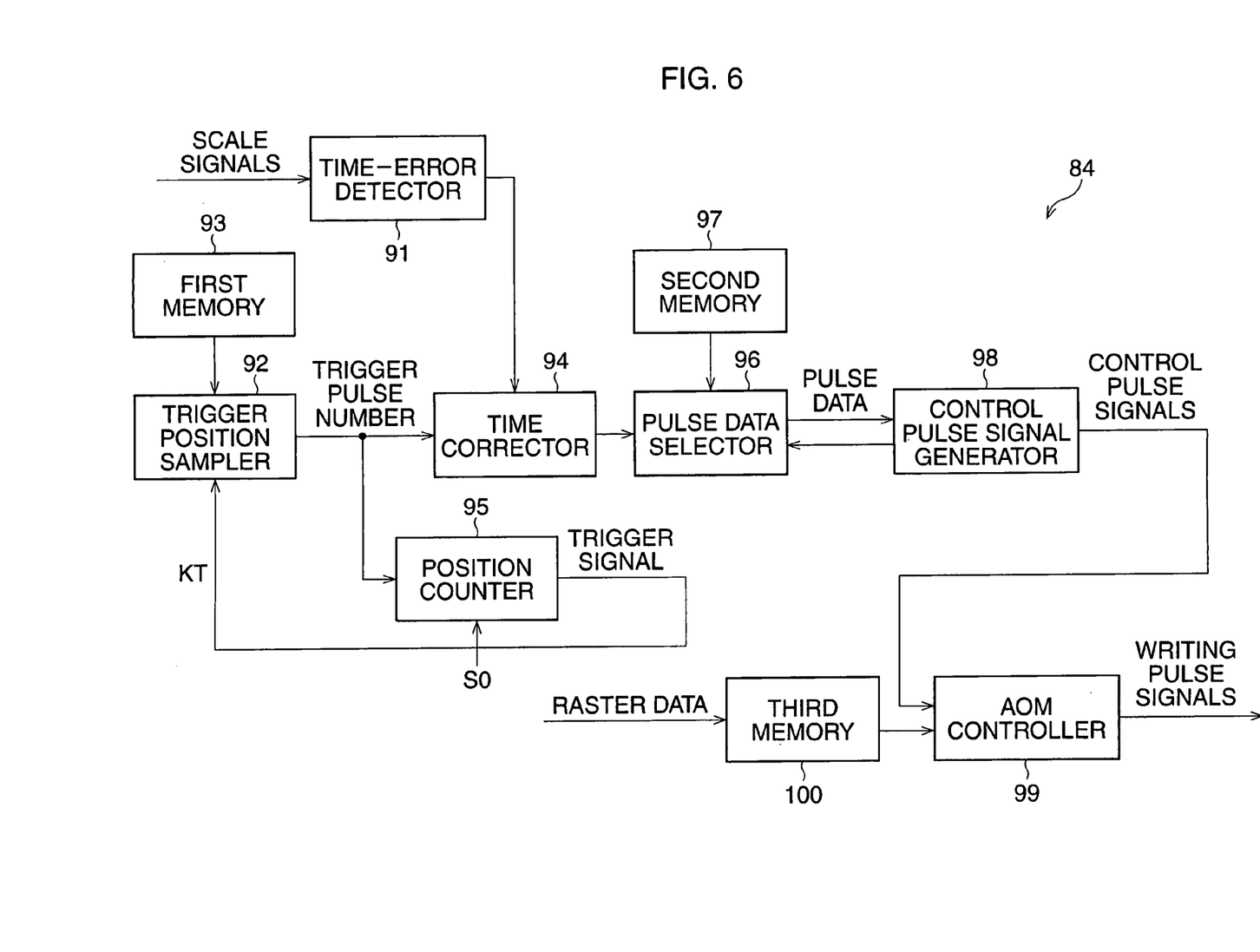
FIG. 6 is a block diagram of a writing pulse signal generator.
Figure 7:
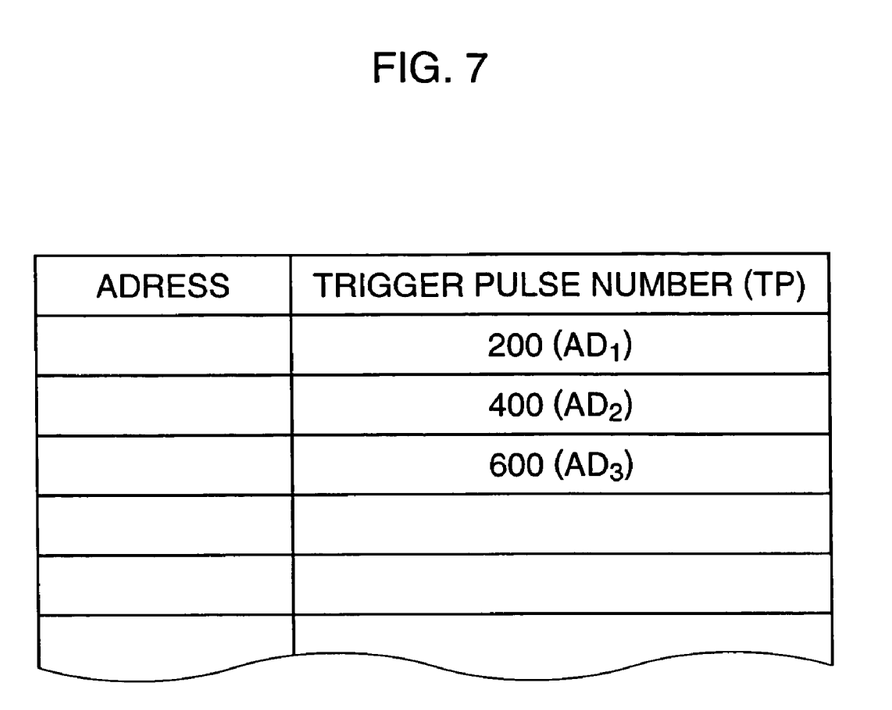
FIG. 7 is a view showing a series of standard pulse numbers stored in a memory.
Figure 8:
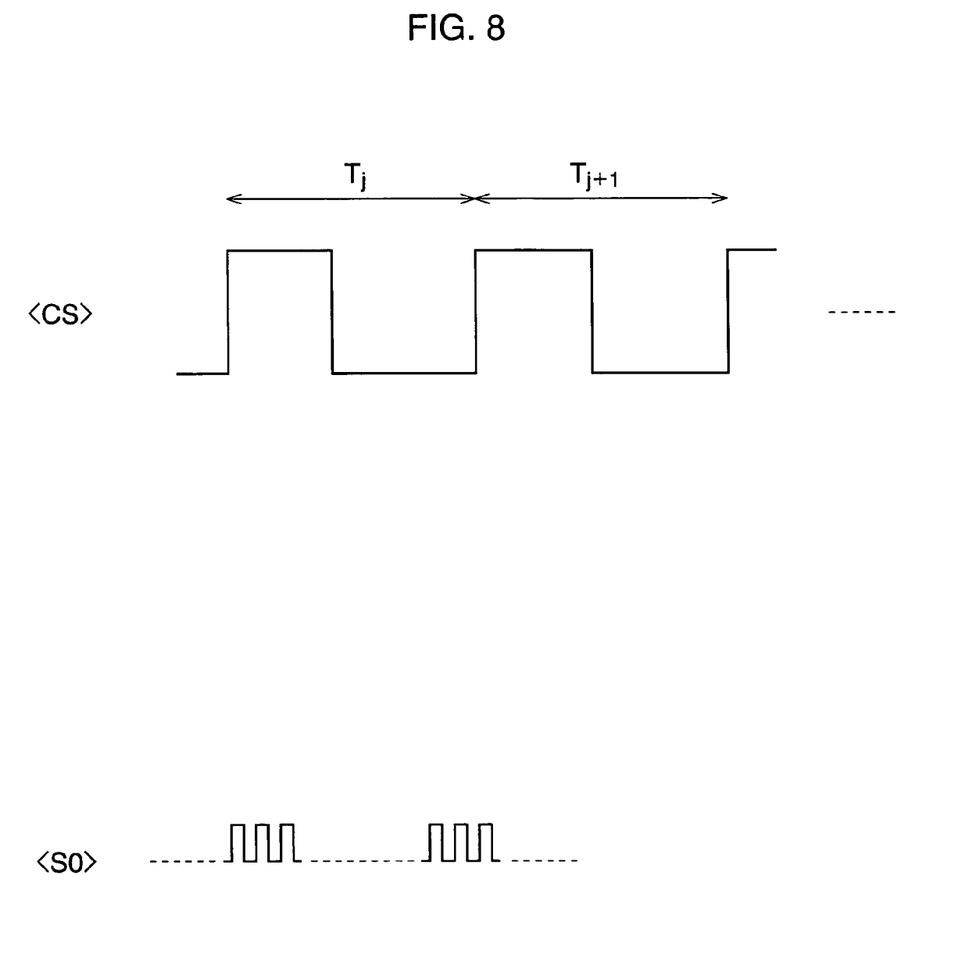
FIG. 8 is a series of scale signals.
Figure 9:
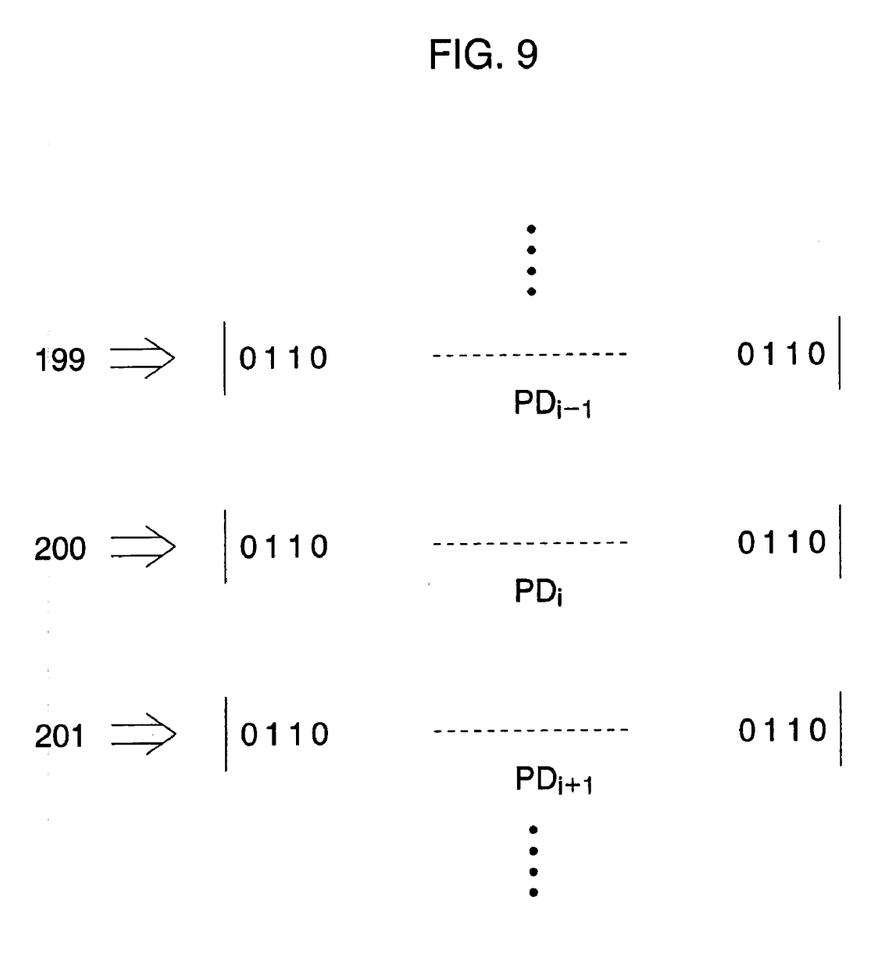
FIG. 9 is a series of sets of pulse data.
Figure 10:
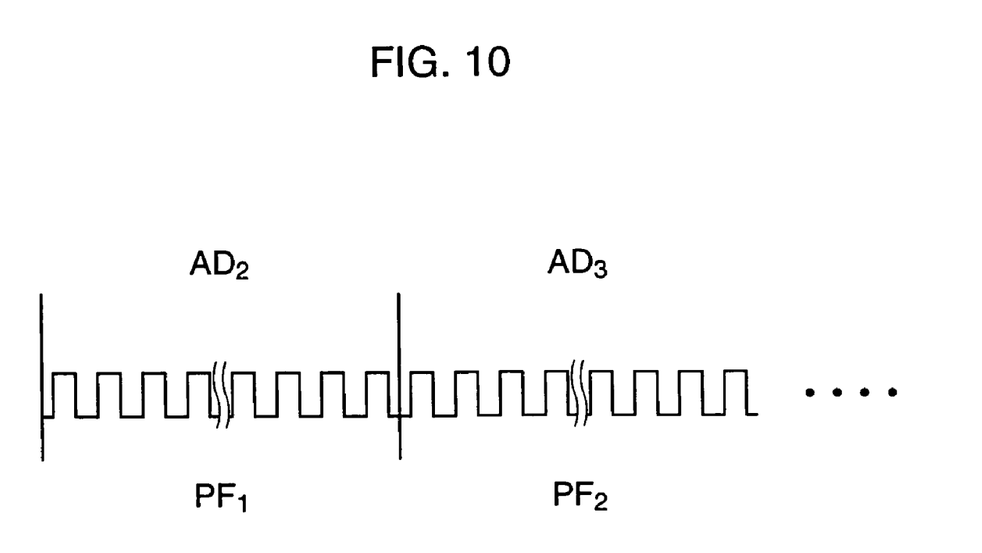
FIG. 10 is a view showing a sequence of control pulse signals.

FIG. 6 is a block diagram of the writing pulse signal generator 84, and FIG. 7 is a view showing a series of standard pulse numbers stored in a memory. FIG. 8 is a series of scale signals, and FIG. 9 is a view showing a series of sets of pulse data. Then, FIG. 10 is a view showing a sequence of control pulse signals.

The writing pulse signal generator 84 has a time-error detector 91, a trigger position sampler 92, a first memory 93, a time-corrector 94, a position counter 95, a pulse data selector 96, a second memory 97, a control pulse signal generator 98, an AOM controller 99, and a third memory 100. The series of scale signals fed from the line sensor 22 is input to the time-error detector 91, and the control pulse signal generator 98 is connected to the AOM controller 99.

When the writing process is started, a timing of the writing-start in each fine section "$AD_j$" is detected by counting a scanning-time from the scanning-start for the scanning-line. In other words, the writing start position of each fine section "$AD_j$" is obtained in order while counting a time that the beam LB takes to pass over the total length of the scanning-line. The scanning-time is measured on the basis of the position of the monitor beam MB. One cycle of the series of scale signals "CS" shown in FIG. 8 corresponds to the fine section "$AD_j$".

The scanning-time is measured by counting the number of pulses of a sequence of standard clock pulse signals "S0". The frequency of the sequence of standard pulse signals "S0" is higher than that of the series of the scale signals "CS", and is defined such that the counted pulse number in each section "$AD_j$" is a sufficiently large number. For example, when the fine section "$AD_j$" is 100 μm and the time-interval "Tj", which is measured by the predetermined scanning-speed, is 1 μs ($1 \times 10^{-6}$ μs), the frequency of the sequence of standard clock pulses "S0" is set to 200 MHz. In this case, the cycle of standard clock pulse signals "CS" is 5 ns ($5 \times 10^{-9}$ s), and the counted pulse number "K" is 200. Note that, the dot-pitch of the pattern is set to 10 μm in accordance with the above length of the fine section "$AD_j$" (100 μm). The pass-time for passing through the interval of one dot-pitch is 100 ns ($100 \times 10^{-9}$ s).

As shown in FIG. 7, in the first memory 93, a series of pulse numbers, which indicate a timing of the scanning-start for each fine section, is stored as data (hereinafter, called the "trigger pulse number"). The trigger pulse number "TP" is a number that is obtained by cumulatively counting from the scanning-start for one scanning-line "LL". For example, when the pulse number in each section is set to "200", the trigger pulse numbers for the fine sections "AD1", "AD2", "AD3", . . . , are defined as "200", "400", "600", . . . in order.

When the laser beam LB is illuminated on a scanning-start point in the scanning-line LL, the trigger pulse number "TP" corresponding to the first fine section "$AD_1$" (for example, 200) is selected in the trigger position sampler 92. The sampled trigger pulse number "TP" is output to the position counter 95 shown in FIG. 6. The sequence of standard clock pulse signals "S0" is then input to the position counter 95, and the pulses of the sequence of standard clock pulse signals "S0" are counted. Then, the trigger pulse number "TP", which is fed from the trigger position sampler 92, is compared to the number of counted pulses.

When the number of counted pulses coincides with the trigger pulse number "TP", a trigger signal "KT" indicating the coincidence is fed to the trigger position sampler 92. The trigger position sampler 92 selects the next trigger pulse number "TP" corresponding to the fine section "$AD_2$" (for example, 400), and outputs it to the time corrector 94 and the position counter 95. The position counter 95 outputs the trigger signal "KT" every time the number of counted pulses coincides with the trigger pulse number "TP". The trigger pulse number is input to the position counter 95 and the time corrector 94.

The series of scale signals "CS" shown in FIG. 8 is output to the time-error detector 91 while scanning the monitor beam MB on the standard scale 24. In the time-error detector 91, the time-interval "$T_j$" (fine-section scanning-time) that is the pass-time of the laser beam LB for the fine section "$AD_j$", is measured by counting the number of pulses of the sequence of standard clock pulse signals "S0". Then, a time-error "$DT_j$" is measured on the basis of the sequence of standard clock pulse signals "S0".

The time-error "$DT_j$" is a difference between the actual scanning-time measured for the fine section "$AD_j$" and the preset standard scanning-time. The time-error "$DT_j$" is represented by pulses corresponding to the difference. When the actual scanning-speed is higher than the preset standard scanning-speed, the negative time-error "$DT_j$" is calculated. On the other hand, when the actual scanning-speed is lower than the standard scanning-speed, the positive time-error "$DT_j$" is calculated. The time-error "$DT_j$" is fed to the time corrector 94.

In the time corrector 94, a difference between a previous trigger pulse number "$TP_{j-1}$", which is previously output from the trigger position sampler 92, and a current trigger pulse number "$TP_j$", which is currently output from the trigger position sampler 92, is calculated as a "pulse difference". Then, the time-error "$DT_j$" is added to the pulse-difference number "$TP_j-TP_{j-1}$", so that the corrected pulse number "K'" is obtained and is output to the pulse data selector 96. For example, when the previous trigger pulse number is "200", the current trigger pulse number is "400", and the time-error "$DT_j$" is "−1", the corrected pulse number "K'" becomes "199".

In the second memory 97, a series of sets of pulse data "$PD_i$" (i=1, 2, . . . ) is stored in advance (See FIG. 9). Each set of pulse data "$PD_i$" has data that is composed of "0" and "1" and is periodically arranged, and defines a timing for turning the AOM 28 ON/OFF. The series of sets of pulse data "$PD_i$" correspond to the standard number "K0" and the corrected pulse number "K'", which vary with the scanning-speed. The pulse data selector 94 selects a set of pulse data corresponding to the corrected pulse number "K'" from the series of sets of pulse data "$PD_i$". The selected set of pulse data is read from the second memory 96 and is output to the control pulse signal generator 98.

The series of sets of pulse data "$PD_1$", "$PD_2$", . . . , is set such that a standard set of pulse data corresponding to the standard pulse number "K0" becomes a central pulse data, and such that the remaining sets of pulse data correspond to continuous varying corrected pulse number "K'" from the standard pulse-number "K0". For example, the standard pulse number "K0" is set to "200" and the set of pulse data "$PD_i$" is set so as to correspond to the standard pulse number "K0", so that the series of sets of pulse data "$PD_1$", "$PD_2$", . . . , "$PD_{i-1}$", "$PD_i$", "$PD_{i+1}$", . . . , respectively correspond to continuous pulse-numbers, . . . , 199, 200, 201, . . . (for example, 200±17). When the corrected pulse-number "K'" of the fine section "$AD_1$" is 199, the set of pulse data "$PD_{i-1}$", corresponding to the pulse number "199", is selected. The set of pulse data "$PD_{i-1}$" has 199 data composed of 0 and 1, which is periodically arranged in accordance with the scanning-speed in the section "$AD_1$".

On the other hand, when the corrected pulse number "K'" of the fine section "$AD_2$" is "201", the set of pulse data "$PD_{i+1}$", corresponding to the pulse number "201", is selected.

The selected set of pulse data is output to the control pulse signal generator 98, wherein a sequence of control pulse signals "$PF_j$" (j=1, 2, . . . ) is successively generated on the basis of the standard clock pulse signals "S0" in each fine section "$AD_j$". The sequence of control pulse signals "$PF_j$" controls an output-timing of the sequence of writing pulse signals. After a sequence of control pulse signals corresponding to one fine section is generated, the control pulse signal generator 98 outputs a reset signal, which requires a next sequence of control pulse signals, to the pulse data selector 96. The pulse data selector 96 feeds the next selected set of pulse data to the control pulse signal generator 98.

The frequency of the sequence of control pulse signals "$PF_j$" corresponds to the measured corresponding time-interval "$T_j$" (fine-section scanning-time), namely, the scanning-speed in the corresponding fine section "$AD_j$". The frequency of the sequence of control pulse signals "$PF_j$" is defined on the basis of the data-array of the corresponding set of pulse data. For example, when the corrected pulse number "K'" in the fine section "$AD_1$" is 199, the sequence of control pulse signals "$PF_1$" is generated on the basis of the set of pulse data "$PD_{i-1}$". On the other hand, when the corrected pulse number "K'" in the fine section "$AD_2$" is 201, the sequence of control pulse signals "$PF_2$" is generated on the basis of the set of pulse data "$PD_{i+1}$". The frequency of the sequence of control pulse signals "$PF_1$" is lower than that of the sequence of control pulse signals "$PF_2$". The sequence of control pulse signals "$PF_j$", which is output from the control pulse signal generator 96, is fed to the AOM controller 99.

Raster data, which corresponds to a circuit-pattern and is fed from a computer system (not shown), is temporarily stored in the third memory 100. Then, the raster data is output from the third memory 100 to the AOM controller 99 in order. The AOM controller 99 outputs the raster data to the AOM driver 85 as the "sequence of writing pulse signals", while synchronizing the raster data with the sequence of control pulse signals "$PF_j$".

When the scanning-speed in the fine section "$AD_j$" is slower, the frequency of the sequence of control pulse signals "$PF_j$" becomes a lower frequency, so that the output time-interval of the sequence of writing pulse signals in the AOM controller 99 becomes longer. On the other hand, when the scanning-speed in the fine section "$AD_j$" is faster, the frequency of the sequence of control pulse signals "$PF_j$" becomes a higher frequency, so that the output time-interval of the sequence of writing pulse signals becomes shorter. Thus, the image-density, namely, the dot-interval is maintained at a constant-interval regardless of the varying scanning-speed.

Note that, the sequence of control pulse signals is not directly used for a fine section that the laser beam LB is currently passing, but is used for an adjacent next fine section. For example, the sequence of control pulse signals "$PF_2$" is generated when the monitor beam MB passes the fine section "$AD_2$", the sequence of control pulse signals "$PF_2$" is utilized for controlling the AOM 28 in the next fine section "$AD_3$". However, since the length-order of each fine section is micrometer-order and the scanning-speed does not vary rapidly, the scanning-speed between the two fine sections adjacent to each other is regarded as a "substantially constant-speed". Therefore, the AOM 28 can be controlled in accordance with the sequence of control pulse signals corresponding to the previous fine section.

In this way, the laser writer 10 generates a sequence of control pulse signals without a PLL circuit, and on the basis of the scanning-speed detected in real time. Thus, the laser writer 10 can rapidly respond to the varying scanning-speeds. Further, since the series of sets of pulse data is stored in the first memory 95 in advance, the length of the fine section "$AD_j$" can be optionally set in accordance with a pattern.

The position of the beam LB may be detected by detecting a rotation-position of the polygon mirror 36 instead of using of the standard scale 24. Another optical modulator may be applied instead of the AOM 28. An alternate exposure optical system may be used. The length of the fine section may be defined such that the length is longer than the dot-pitch, or dot-interval.

A laser scanner using a photoreceptor may be applied instead of the laser writer using the substrate.

Finally, it will be understood by those skilled in the art that the foregoing description is of preferred embodiments of the device, and that various changes and modifications may be made to the present invention without departing from the spirit and scope thereof.

The present disclosure relates to subject matters contained in Japanese Patent Application No. 2003-129749 (filed on May 8, 2003), which is expressly incorporated herein, by reference, in its entirety.

The invention claimed is:

1. An apparatus for forming a pattern comprising:
   a light source that emits a beam;
   a scanning unit that scans the beam on a photosensitive material;
   a scanning-time setter that sets a fine-section scanning-time as a pass-time of the beam for each section of a series of fine sections, the series of fine sections being defined by dividing a scanning-line into constant-intervals;
   a time-error detector that successively detects a time-error between the set fine-section scanning-time and an actually detected fine-section scanning-time for each fine section;
   a scanning-time corrector that successively corrects the set fine-section scanning-time for each fine section on the basis of the time-error, to successively generate a corrected fine-section scanning-time;
   a pulse data selector that successively selects a set of pulse data, corresponding to the corrected fine-section scanning-time, from a series of sets of pulse data, each of said series of sets of pulse data having a different data-array in accordance with the corrected fine-section scanning-time;
   a control pulse signal generator that successively generates a sequence of control pulse signals in accordance with the selected set of pulse data;
   a writing pulse signal generator that successively generates a sequence of writing pulse signals in accordance with the sequence of control pulse signals, the sequence of control pulse signals controlling the output-timing of the sequence of writing pulse signals; and
   an optical modulator that modulates the beam in accordance with the sequence of writing pulse signals.

2. The apparatus of claim 1, wherein said time-error detector detects the time-error by using a sequence of standard clock pulse signals with a predetermined frequency that is higher than a frequency necessary for counting a scanning-time corresponding to a dot-pitch.

3. The apparatus of claim 1, wherein the series of sets of pulse data comprises a standard set of pulse data that corresponds to a standard fine-section scanning-time detected by using a predetermined scanning-speed, and a plurality of sets of corrected pulse data that respectively correspond to a plurality of corrected fine-section scanning-times that vary continuously and that deviate from the standard fine-section scanning-time.

4. The apparatus of claim 1, wherein said time-error detector comprises a standard scale that has a plurality of slits, the slits being regularly formed at a constant-interval, the length of a fine section being defined in accordance with a slit-pitch;

wherein said scanning unit comprises a beam splitter that splits the beam from said light source into a scanning-beam for scanning and a monitor-beam for detecting a position of the scanning-beam, said scanning unit scanning the monitor beam on said standard scale, said time-error detector detecting the fine-section scanning-time on the basis of a series of scale signals obtained from passing-light that passes the slits periodically.

5. The apparatus of claim 1, wherein said optical modulator comprises an AOM (Acousto-Optical Modulator).

6. The apparatus of claim 1, wherein said scanning unit comprises a polygon mirror.

7. An apparatus for generating a sequence of control pulse signals comprising:

a scanning-time setter that sets a fine-section scanning-time as a pass-time of a beam for each section of a series of fine sections, the series of fine sections being defined by dividing a scanning-line into constant-intervals;

a time-error detector that successively detects a time-error between the set fine-section scanning-time and an actually detected fine-section scanning-time in each fine section;

a scanning-time corrector that successively corrects the set fine-section scanning-times for each fine section on the basis of the time-error to successively generate a corrected fine-section scanning-time;

a pulse data selector that successively selects a set of pulse data, corresponding to the corrected fine-section scanning-time, from a series of sets of pulse data, each of said series of sets of pulse data having a different data-array in accordance with the corrected fine-section scanning-time; and a control pulse signal generator that successively generates a sequence of control pulse signals in accordance with the selected set of pulse data, the sequence of control pulse signals controlling the output-timing of a sequence of writing pulse signals for controlling an optical modulator.

8. A Method for generating a sequence of control pulse signals comprising:

setting a fine-section scanning-time as a pass-time of a beam in each section of a series of fine sections, the series of fine sections being defined by dividing a scanning-line into constant-intervals;

successively detecting a time-error between the set fine-section scanning-time and an actually detected fine-section scanning-time for each fine section;

successively correcting the set fine-section scanning-time for each fine section on the basis of the time-error, to successively generate a corrected fine-section scanning-time;

successively selecting a set of pulse data, corresponding to the corrected fine-section scanning-time, from a series of sets of pulse data, each of said series of sets of pulse data having a different data-array in accordance with the corrected fine-section scanning-time; and successively generating a sequence of control pulse signals in accordance with the selected set of pulse data, the sequence of control pulse signals controlling the output-timing of a sequence of writing pulse signals for controlling an optical modulator.

* * * * *